United States Patent
Someya

(10) Patent No.: US 8,131,243 B2
(45) Date of Patent: Mar. 6, 2012

(54) RECEIVING CIRCUIT AND TIMEPIECE

(75) Inventor: Kaoru Someya, Kiyose (JP)

(73) Assignee: Casio Computer Co., Ltd., Tokyo (JP)

( * ) Notice: Subject to any disclaimer, the term of this patent is extended or adjusted under 35 U.S.C. 154(b) by 646 days.

(21) Appl. No.: 12/247,382

(22) Filed: Oct. 8, 2008

(65) Prior Publication Data

US 2009/0111402 A1    Apr. 30, 2009

(30) Foreign Application Priority Data

Oct. 29, 2007  (JP) ................................ 2007-280123

(51) Int. Cl.
*H04B 1/06* (2006.01)
(52) U.S. Cl. .......................... 455/260; 455/334; 375/327
(58) Field of Classification Search .......... 455/255–260, 455/323, 334, 339–341; 375/327
See application file for complete search history.

(56) References Cited

U.S. PATENT DOCUMENTS

| | | | |
|---|---|---|---|
| 5,373,533 A | 12/1994 | Hayashihara et al. | |
| 5,732,110 A | 3/1998 | Richards | |
| 6,442,380 B1 * | 8/2002 | Mohindra | 455/234.1 |
| 2005/0159180 A1 * | 7/2005 | Cheng et al. | 455/552.1 |
| 2005/0260957 A1 | 11/2005 | Someya | |
| 2006/0068746 A1 * | 3/2006 | Feng et al. | 455/323 |
| 2008/0025155 A1 | 1/2008 | Someya | |
| 2008/0043818 A1 * | 2/2008 | Tal et al. | 375/135 |

FOREIGN PATENT DOCUMENTS

| | | |
|---|---|---|
| JP | 4-313939 A | 11/1992 |
| JP | 9-505972 A | 6/1997 |
| JP | 2004-104555 A | 4/2004 |

OTHER PUBLICATIONS

Japanese Office Action dated Feb. 9, 2010 and English translation thereof issued in a counterpart Japanese Application No. 2007-280123.

* cited by examiner

*Primary Examiner* — Nhan Le
(74) *Attorney, Agent, or Firm* — Holtz, Holtz, Goodman & Chick PC

(57) ABSTRACT

In a receiving circuit 44 for receiving an electromagnetic wave signal, a frequency converter/detector circuit 100 comprises a local oscillator 131 for generating an oscillation signal, plural mixers 133, 134 for mixing the received electromagnetic wave signal with the oscillation signal to generate intermediate frequency signals having different phases, and a signal generating/synthesizing circuit 140 for generating based on the intermediate frequency signals generated by the mixers other intermediate frequency signals which are different in phase from the original intermediate frequency signals, for detecting the intermediate frequency signals and other intermediate frequency signal, and for adding the detected signals together to generate a synthesized signal.

7 Claims, 12 Drawing Sheets

US 8,131,243 B2

RECEIVING CIRCUIT AND TIMEPIECE

CROSS REFERENCE TO RELATED APPLICATIONS

This application is based upon and claims the benefit of priority from the prior Japanese Patent Application No. 2007-280123, filed Oct. 29, 2007, the entire contents of which are incorporated herein by reference.

BACKGROUND OF THE INVENTION

1. Field of the Invention

The present invention relates to a receiving circuit and a timepiece having the receiving circuit.

2. Description of the Related Art

In some country, a long-wave standard radio wave carrying a time code is transmitted from a transmitting station. Radio-controlled clocks are in practical use, which receive the standard wave to detect the time code and accurately adjusts the time of day based on the detected time code. In Japan, there are two transmitting stations. The transmitting station transmits the standard wave of a carrier frequency 40 kHz and the standard wave of a carrier frequency 60 kHz respectively. The time code is frame data of a period 60 sec.

In a receiving circuit for receiving the standard wave, for instance, in a superheterodyne receiving circuit, the standard wave of the carrier frequency 40 kHz and a local oscillation signal are mixed together to create an intermediate frequency signal of an intermediate frequency (for example, 30 Hz), and the created intermediate frequency signal is supplied to a filter to remove the intermediate frequency component included therein.

FIG. 15 is a view showing a conventional frequency converter circuit and detecting circuit. The standard wave signal of the carrier frequency 40 kHz is amplified by an amplifier 200, and further applied to a mixer 202. The mixer 202 mixes the amplified standard wave signal with a local oscillation signal (for instance, 39.97 kHz) of OSC (local oscillator) 201 to produce an intermediate frequency signal of a frequency 90 Hz. The produced intermediate frequency signal is supplied to BPF (band pass filter) 203, which allows only frequency components within a frequency range close to 90 Hz to pass through. The signal passing through the filter is supplied to a detector 205 through an amplifier 204. The detected signal is supplied to LPF (low pass filter) 206. At LPF, an intermediate frequency component is completely removed from the detected signal, whereby only a desired signal is obtained.

U.S.P. 2005-0260957 A1 discloses a technique for receiving the long-wave standard radio wave, in which a frequency multiplier switches between local oscillation signals to be supplied to a frequency converter, whereby an intermediate frequency signal is created both from the radio wave signals of 40 kHz and 60 kHz. An oscillator is also disclosed, which has an oscillation signal of a frequency in the range between two frequencies.

As described with reference to the receiving circuit shown in FIG. 15, when the intermediate frequency is low in the range of about 90 Hz, it is necessary for adequately removing the intermediate frequency component to reduce the cut off frequency of LPF and/or to use a high order filter. It is necessary for sufficiently integrating the intermediate frequency signal of 90 Hz to increase the time constant of LPF. For instance, if the cut off frequency f0 of LPF is set to 5 Hz to allow a signal of 5 Hz pass through, it is found that the signal component of 90 Hz attenuates only to the extent of 25 dB, leaving a ripple component.

Reducing the cut off frequency of LPF brings a disadvantage that a modulated signal is distorted. If the high order filter is used, another problem is invited that the circuit is made complex and the circuit scale becomes large.

The present invention has an object to provide a receiving circuit including a frequency converting/detecting circuit and to provide a time piece having the receiving circuit, wherein the frequency converting/detecting circuit has a simple circuit configuration and is capable of receiving a modulated signal in high accuracy.

SUMMARY OF THE INVENTION

According to one aspect of the invention, there is provided a receiving circuit, which comprises an antenna circuit for receiving an electromagnetic wave to obtain an electric signal, an amplifying unit for amplifying the electric signal obtained by the antenna circuit, a frequency converter/detector unit for converting a frequency of the electric signal amplified by the amplifying unit to obtain an intermediate frequency signal, and for detecting the intermediate frequency signal, thereby outputting a demodulated signal, and a filtering unit for removing an intermediate frequency component from the demodulated signal output from the frequency converter/detector unit, wherein the frequency converter/detector unit comprises a local oscillator for generating an oscillation signal, plural mixers for mixing the electric signal amplified by the amplifying unit with the oscillation signal from the local oscillator to generate a first intermediate frequency signal and a second intermediate frequency signal, wherein the first intermediate frequency signal and second intermediate frequency signal are shifted in phase from each other by 90 degrees, and a signal generating/synthetsizing unit for generating other intermediate frequency signals based on the first intermediate frequency signal and the second intermediate frequency signal, wherein said other intermediate frequency signals are shifted in phase from the first intermediate frequency signal and the second intermediate frequency signal, and for detecting the first intermediate frequency signal, the second intermediate frequency signal and said other intermediate frequency signals and adding the detected signals together, whereby generating a synthesized signal.

According to another aspect of the invention, there is proved a timepiece, which comprises an antenna circuit for receiving an electromagnetic wave carrying time information to obtain an electric signal, an amplifying unit for amplifying the electric signal obtained by the antenna circuit, a frequency converter/detector unit for converting a frequency of the electric signal amplified by the amplifying unit to obtain an intermediate frequency signal, and for detecting the intermediate frequency signal, thereby outputting a demodulated signal, a filtering unit for removing an intermediate frequency component from the demodulated signal output from the frequency converter/detector unit, an extracting unit for extracting the time information from the signal output from the filtering unit, a time counting unit for counting time, a display unit for displaying the time counted by the time counting unit and a time correcting unit for correcting the time counted by the time counting unit based on the time information extracted by the extracting unit, wherein the frequency converter/detector unit comprises a local oscillator for generating an oscillation signal, plural mixers for mixing the signal amplified by the amplifying unit with the oscillation signal generated by the local oscillator to generate a first intermediate frequency signal and a second intermediate frequency signal, wherein the first intermediate frequency signal and second intermediate frequency signal are shifted in phase from each other by 90 degrees and a signal generating/synthetsizing unit for generating other intermediate frequency signals based on the first intermediate frequency signal and the second intermediate frequency signal, wherein said other intermediate frequency signals are shifted in phase from the first intermediate frequency signal and the second intermediate frequency signal, and for detecting the first intermediate frequency signal, the second intermediate frequency signal and said other intermediate frequency signals and adding the detected signals together, whereby generating a synthesized signal.

DETAILED DESCRIPTION OF THE PREFERRED EMBODIMENTS

Circuit Configuration

Figure 1:
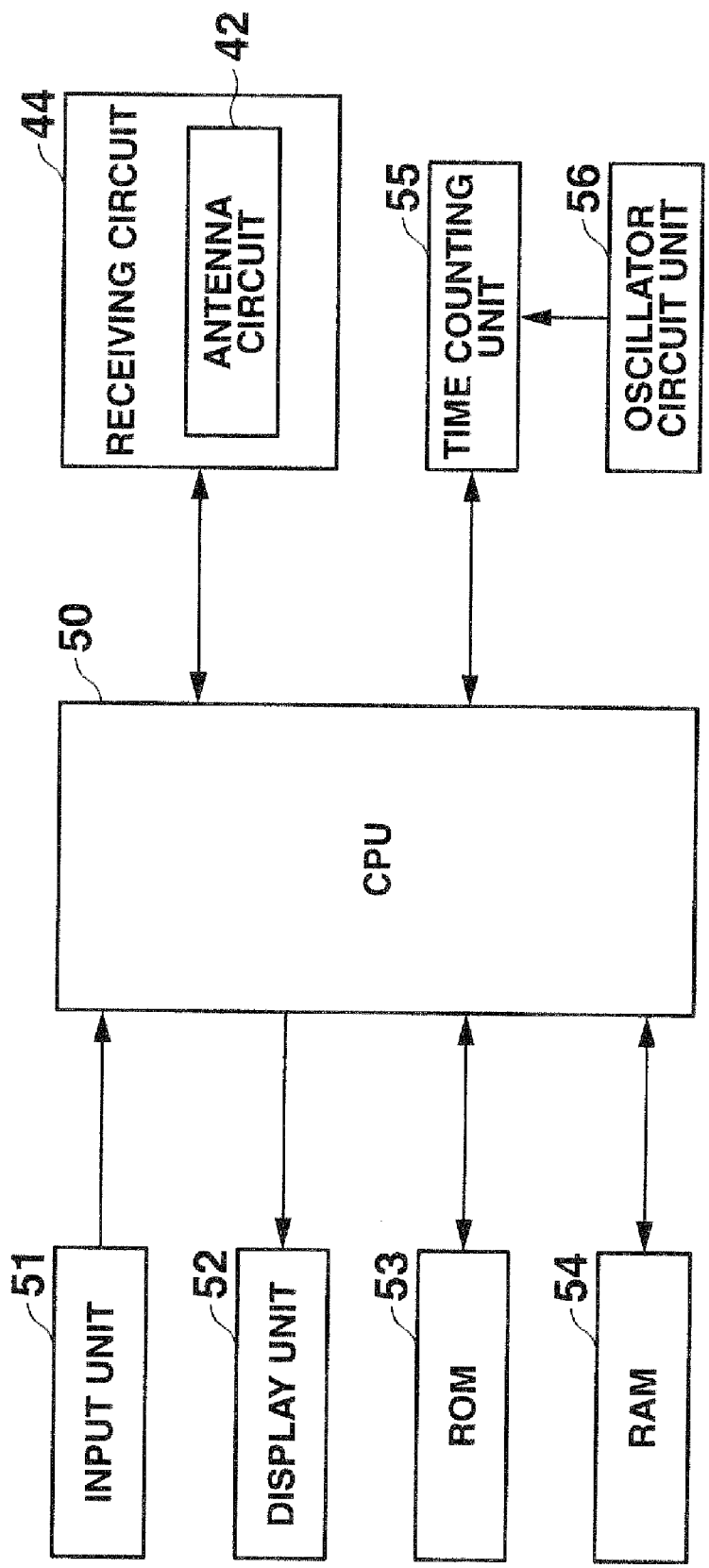
FIG. 1 is a block diagram showing a circuit configuration of a timepiece according to the first embodiment of the invention.

Now, embodiments of the present invention will be described in detail with reference to the accompanying drawings. FIG. 1 is a block diagram showing a circuit configuration of a timepiece according the first embodiment of the invention. As shown in FIG. 1, the timepiece comprises CPU 50, input unit 51, display unit 52, ROM 53, RAM 54, receiving circuit 44, time counting circuit unit 55 and oscillator circuit unit 56.

CPU 50 reads a program stored in ROM 53 at a certain timing or in response to an operation signal input from the input unit 51, and expands the read program on RAM 54. Further, CPU 50 gives instructions and sends data to various portions in the timepiece in accordance with the program on RAM 54. More specifically, CPU 50 controls the receiving circuit 44 every certain time period to receive a standard radio wave, and performs a correcting process for correcting current time data counted by the time counting circuit unit 55 in accordance with a signal including a time code sent from the receiving circuit 44 and a transferring process for transferring to the displaying unit 52 the current time data counted by the time counting circuit unit 55.

The input unit 51 has various switches (not shown) for giving instructions to perform various functions of the timepiece. When the switch is operated, the input unit 51 sends an appropriate operation signal to CPU 50. The display unit 52 has a dial plate (not shown), analog pointer mechanism (not shown) controlled by the CPU 50, and a liquid crystal display panel (not shown). The display unit 52 displays the current time counted by the time counting circuit unit 55 on the liquid crystal display panel. ROM 53 stores a system program, application programs, data, etc. necessary for operating the timepiece, and/or performing certain functions. RAM 54 is used as a work area of CPU 50, and also temporarily stores a program and data read from ROM 53 and data processed by CPU 50.

The receiving circuit 44 has an antenna circuit 42. The receiving circuit 44 detects a signal of a certain frequency from the radio wave signal received by the antenna circuit 42, and supplies the detected signal to CPU 50. The time counting circuit unit 55 counts a signal sent from the oscillator circuit unit 56 to count the current time, and outputs current time data to CPU 50. The oscillator circuit unit 56, at all times, outputs a clock signal having a constant frequency.

Figure 2:
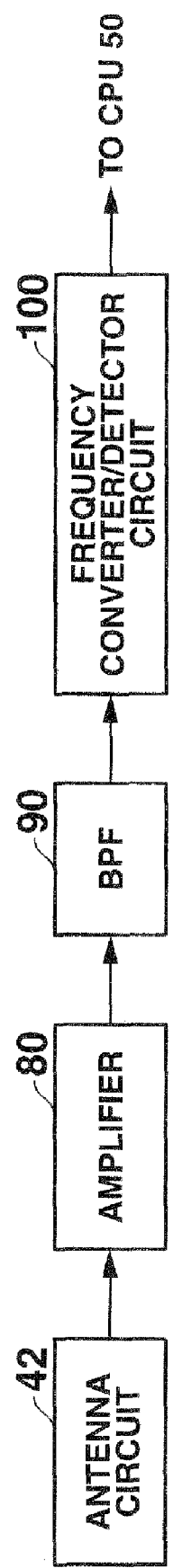
FIG. 2 is a block diagram showing a circuit configuration of a receiving circuit according to the embodiment of the invention.

FIG. 2 is a block diagram of the receiving circuit 44 in the embodiment of the timepiece. As shown in FIG. 2, the timepiece has the antenna circuit 42, amplifier 80, band pass filter (BPF) 90, and a frequency converter/detector circuit 100. In receiving circuit, a low pass filter (LPF) may be used in place of the band pass filter 90.

Figure 3:
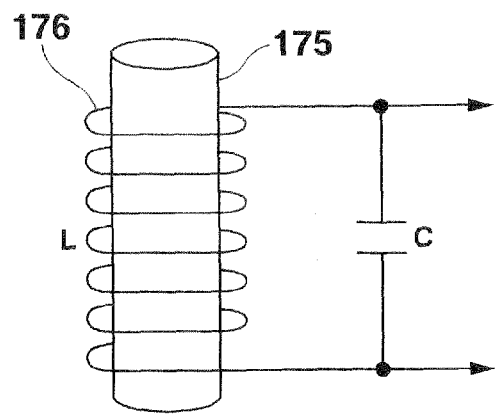
FIG. 3 is a view showing an example of an antenna circuit in the embodiment of the invention.

The antenna circuit 42 has a parallel connection of a capacitor C and a coil L (wire 176 winded around a magnet material 175) as shown in FIG. 3. A signal corresponding to a standard wave (time calibration signal) is supplied from the antenna circuit 42 to the frequency converter/detector circuit 100 through the amplifier 80 and BPF 90.

The frequency converter/detector circuit 100 converts the received signal into an intermediate frequency signal, and detects the intermediate frequency signal to demodulate the standard wave signal. The standard wave signal including a time code is supplied to CPU 50. CPU 50 decodes the standard wave signal to detect time information.

Frequency Converter/Detector Circuit

Now, the frequency converter/detector circuit 100 in the first embodiment of the invention will be described in more detail.

Figure 4:
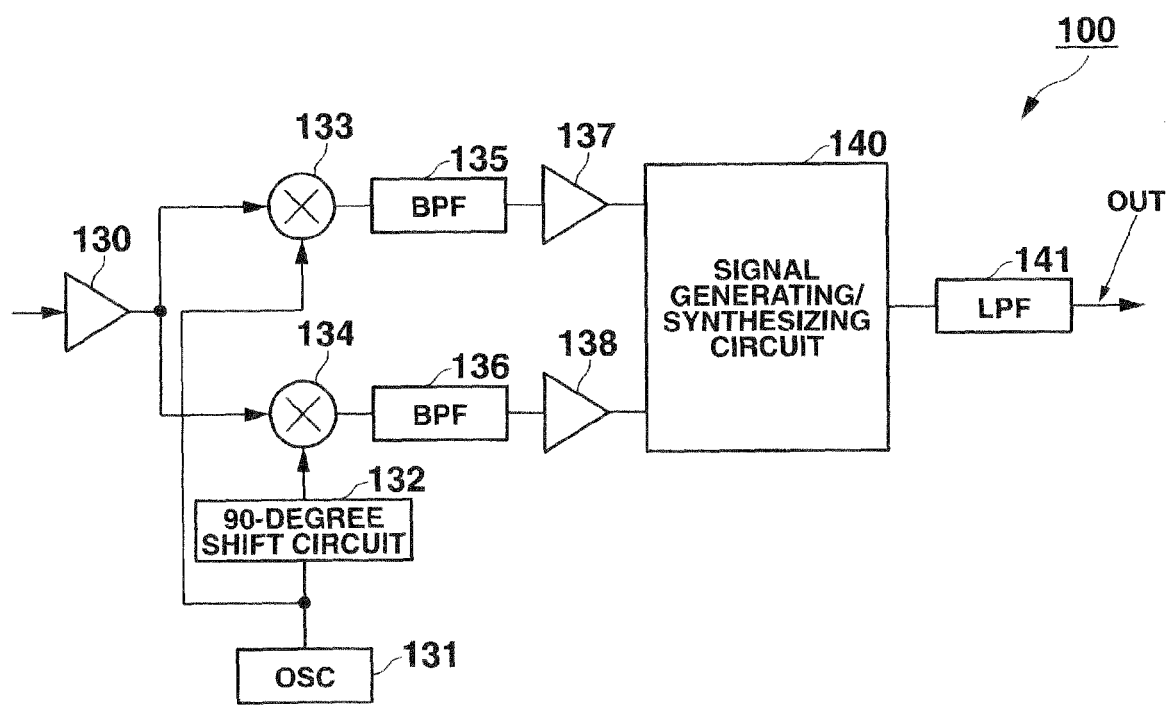
FIG. 4 is a view showing an example of a frequency converter/detector circuit in the first embodiment of the invention.

FIG. 4 is a block diagram of the frequency converter/detector circuit 100 in the first embodiment of the invention. As shown in FIG. 4, the frequency converter/detector circuit 100 has an amplifier 130, local oscillator 131, 90-degree shift circuit 132, mixers 133, 134, band pass filters (BPFs) 135, 136, amplifiers 137, 138, signal generating/synthetsizing circuit 140 to be described later in detail, and low pass filter (LPF) 141.

The local oscillator 131 generates, for example, an oscillation signal of 39.91 KHz (in case of a received wave signal of 40 KHz) The oscillation signal of the local oscillator 131 is applied to the mixer 133 and also to the 90-degree shift circuit 132. The oscillation signal whose phase is shifted by 90 degrees by 90-degree shift circuit 132 is applied to the mixer 134.

BPFs 135, 136 receive signals from the mixers 133, 134 respectively to generate intermediate frequency signals (in the above example, intermediate signals of 90 Hz). The intermediate frequency signals are shifted in phase from each other by 90 degrees (I-signal, Q-signal generated by the quadrature detection). The signal output from BPF 135 is supplied to the signal generating/synthesizing circuit 140 through the amplifier 137. Meanwhile, the signal output from BPF 136 is supplied to the signal generating/synthesizing circuit 140 through the amplifier 138.

Further, a signal output from the signal generating/synthesizing circuit 140 is supplied to LPF 141.

Figure 5:
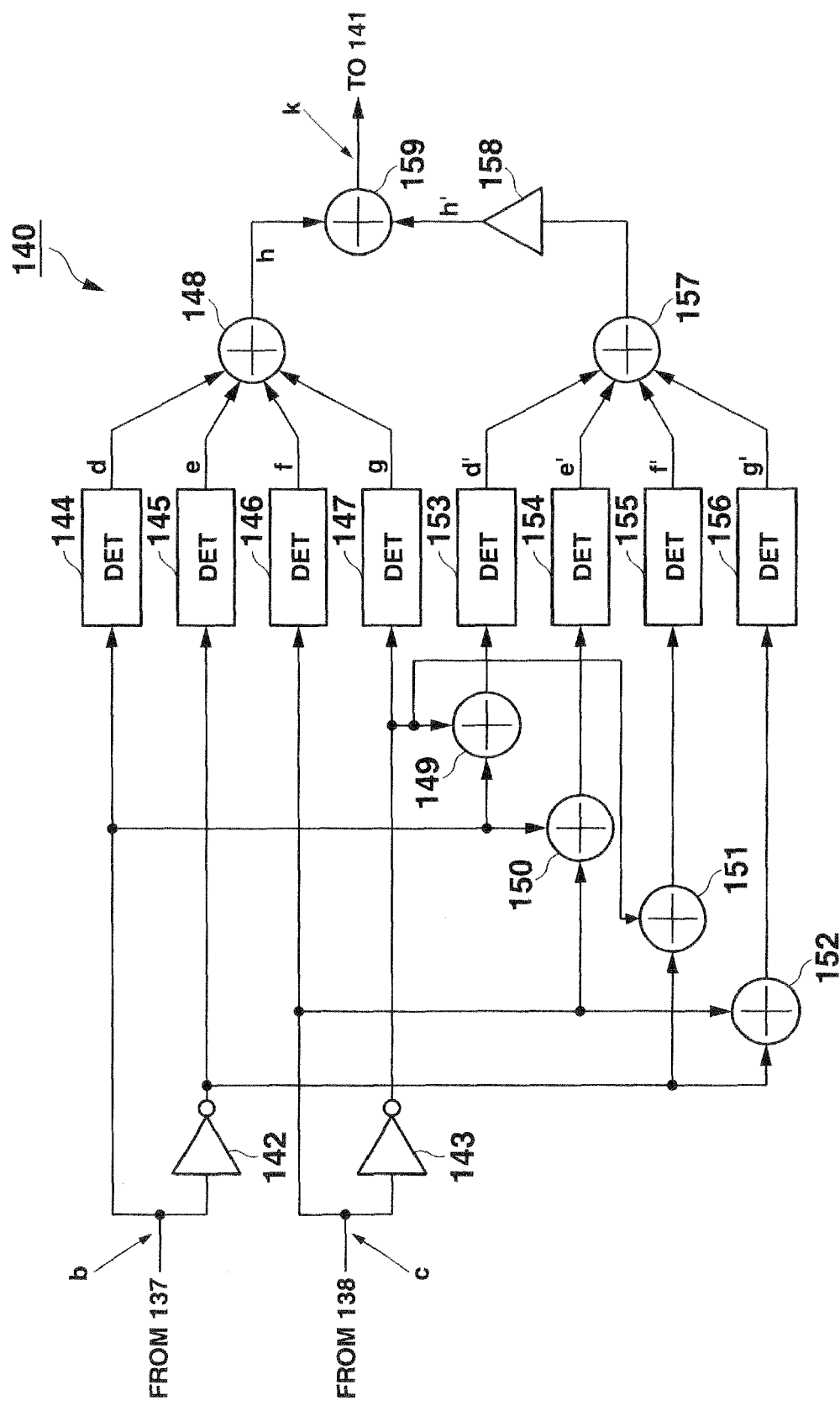
FIG. 5 is a view showing a signal generating/synthetsizing circuit in the first embodiment of the invention.

FIG. 5 is a block diagram of a circuit configuration of the signal generating/synthesizing circuit 140 in the first embodiment of the invention. As shown in FIG. 5, the signal generating/synthesizing circuit 140 has the first to fourth detectors 144, 145, 146, and 147, wherein the first detector 144 receives the signal (I-signal) from the amplifier 137, the second detector 145 receives the sign (reversed I-signal) from the amplifier 137 through the amplifier 142, the third detector 146 receives the signal (Q-signal) from the amplifier 138, and the fourth detectors 147 receives the signal (reversed Q-signal) from the amplifier 138 through the amplifier 143.

Output signals from the first to fourth detectors 144, 145, 146, and 147 are added together by an adder 148.

Further, the signal generating/synthesizing circuit 140 in the first embodiment of the invention has adders 149, 150, 151, and 152, and the fifth to eighth detectors 153, 154, 155, and 156, wherein the adder 149 adds I-signal and the reversed Q-signal together, the adder 150 adds I-signal and Q-signal together, the adder 151 adds the reversed I-signal and the reversed Q-signal together, and the adder 152 adds the reversed I-signal and Q-signal together, and the fifth to eighth detectors 153, 154, 155, and 156 receive output signals from the adders 149, 150, 151, and 152. Output signals from the fifth to eighth detectors 153, 154, 155, and 156 are added together by an adder 157.

Further, the signal generating/synthesizing circuit 140 has a multiplier 158 and an adder 159. The multiplier 158 adjusts and multiplies an output signal of the adder 157 by ($1/\sqrt{2}$), as will be described later. The adder 159 adds an output signal of the adder 148 and an output signal of the multiplier 158 together.

An output signal (synthesized signal) of the adder 159 is supplied to LPF 141 (shown in FIG. 4). An output signal from LPF 141 is supplied to CPU 50, and CPU 50 decodes the received signal to detect time information.

Hereinafter, operation of the signal generating/synthesizing circuit 140 in the first embodiment of the invention will be described in detail.

The standard wave of radio-controlled clocks is slow (1 bps) particularly in data transmission. Therefore, it is hard to raise the integration time constant in LPF (for instance, in LPF 141 in FIG. 4) receiving the output signal from the detector. In the signal generating/synthesizing circuit 140 in the first embodiment of the invention, intermediate frequency signals, which are shifted in phase by 90 degrees are generated by the quadrature detection. The intermediate frequency signal (I-signal) from the amplifier 137 and its reversed intermediate frequency signal (reversed I-signal) are detected by the detectors 144 and 145, respectively. In the similar manner, the intermediate frequency signal (Q-signal) from the amplifier 138 and its reversed intermediate frequency signal (reversed Q-signal) are detected by the detectors 146 and 147, respectively. The signals detected by the detectors 144, 145, 146 and 147 are supplied to the adder 148. Further, I-signal and the reversed Q-signal are added together by the adder 149 and are detected by the detector 153. I-signal and the Q-signal are added together by the adder 150 and are detected by the detector 154. The reversed I-signal and the reversed Q-signal are added together by the adder 151 and are detected by the detector 155. The reversed I-signal and Q-signal are added together by the adder 152 and are detected by the detector 156. The signals detected by the detectors 153, 154, 155 and 156 are supplied to the adder 157.

More specifically, the output signal of the amplifier 130 (in FIG. 4) is subjected to the quadrature detection, whereby signals (appearing at the outputs "b" and "c" of the amplifiers 137 and 138 in FIG. 5) are generated, which are shifted in phase from each other by 90 degrees.

Now, it is assumed that the signal at the point "b" is expressed in sin ωt. Then, a signal at the point "c" will be expressed in cos ωt, because the signals at the points "b" and "c" are shifted in phase from each other by 90 degrees. Further, it is assumed in FIG. 5, that the sum of the output signal (signal at the point "d") of the first detector 144 and the output signal (signal at the point "e") of the first detector 145 is expressed in "d +e", and the sum of the output signal (signal at the point "f") of the third detector 146 and the output signal (signal at the point "g") of the first detector 147 is expressed in "f+g", then "d+e" and "f+g" will be given as follows:

$$d+e = |\sin \omega t| = \sqrt{(1-\cos 2\omega t)}/\sqrt{2} \quad (1)$$

$$f+g = |\cos \omega t| = \sqrt{(1+\cos 2\omega t)}/\sqrt{2} \quad (2)$$

where each detector detects and outputs the positive half portion of the signal.

The output signal of the adder 148 has a level equivalent to the maximum level Max {d+e, f+g}. When the output signal is expressed by "h", the output signal "h" will be given as follows:

$$h = \text{Max} \{\sqrt{(1+\cos 2\omega t)}/\sqrt{2}, \sqrt{(1-\cos 2\omega t)}/\sqrt{2}\} \quad (3)$$

Figure 6:
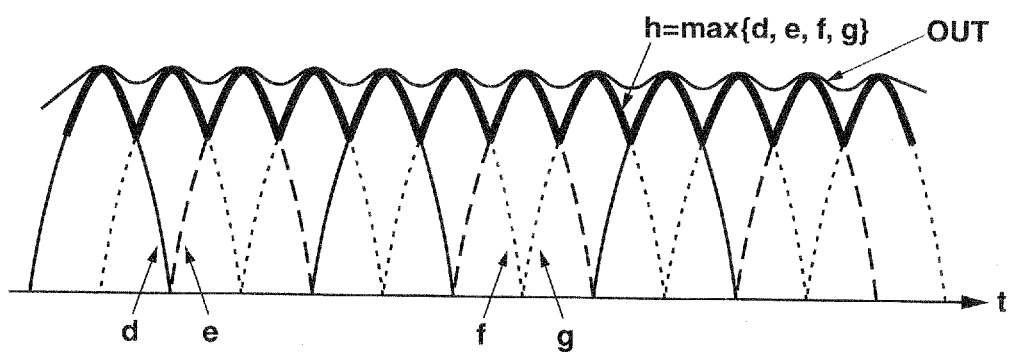
FIG. 6 is a view showing an example of a synthesized signal appearing at a point "h" in FIG. 5.

FIG. 6 is a graph illustrating the synthesized signal "h" (Max {d+e, f+g}) of the signals at the points "d", "e", "f", and "g". In FIG. 6, a signal OUT represents the signal "h" which passes through LPF 141.

Since the term (1+cos 2ωt) or (1−cos 2ωt) in the above expression (3) is not less than "0", the maximum value or minimum value of the expression (3) will be given below.

The value of the expression (3) reaches the maximum, when cos 2ωt=±1, and ωt=π/4×n (n is an integer). That is, "h"=1. The value of the expression (3) reaches the minimum at the points where the signal and the signal shifted in phase by π/4 intersect with each other as shown in FIG. 6, or when ωt=π/8×m (m is an integer). That is, "h"=$\sqrt{2}/2$. The difference between the maximum value and the minimum value of the expression (3) will be given as follows:

$$h\text{max} - h\text{min} = 1 - \sqrt{2}/2 \quad (4)$$

With reference to the maximum value of "h", the ripple will be given by "the maximum value−the minimum value", that is, the ripple is given by the expression (4). As the result, the synthesis of the output signals "d", "e", "f" and "g" of the detectors 144, 145, 146 and 147 realizes the filter effect of 10.7 dB. As shown in FIG. 4, it will be deemed that a signal is generated having a frequency which is 4 times of the original signals. Therefore, the filter effect of LPF (single stage RC filter) will be shown in FIG. 7, where a symbol "f" denotes a frequency, and a symbol "f0" denotes the cut off frequency, and an attenuation characteristic is expressed in $1/\sqrt{(1+(f/f0)^2)}$.

(1) If an original signal detected by a conventional detector is subjected to a filtering process of 5 Hz, the attenuation characteristic will be −25.1 dB. On the contrary, (2) the signal at the point "h" in FIG. 5 is subjected to the filtering process of 5 Hz, the attenuation characteristic will be −37.1 dB, because the frequency of the signal at the point "h" is four times higher than the frequency of the original signal.

As described above, using the signal generating/synthesizing circuit 140, the filtering process of 10.7 dB is realized and also even if the filtering process of 5 Hz is used, the attenuation characteristic of −47.8 dB is obtained. If the conventional detector is used as in the case of (1), and a primary low pass filter (LPF) is used, such LPF must have the cut off frequency f0 of about 0.3 Hz in order to obtain the attenuation characteristic of −45 dB, which is substantially the same level as in the case of (2). In the case of using such LPF, the signal passing through LPF of the cut off frequency of about 0.3 Hz deteriorates significantly. To avoid the signal deterioration, a higher order of filter must be used.

On the contrary, in the first embodiment two intermediate frequency signals (I-signal and Q-signal), which are different in phase from each other by 90 degrees, are obtained, and I-signal and the reversed I-signal and Q-signal and the reversed Q-signal are subjected to the detecting process, and the detected signals are combined, whereby the synthesized signal is obtained having a ripple of an extremely low level. The synthesized signal is deemed having a frequency which is four times higher than the frequency of the original signal. Therefore, an adequate filtering effect can be realized using a filter of a simple configuration and further the signal deterioration can be avoided.

Figure 7:
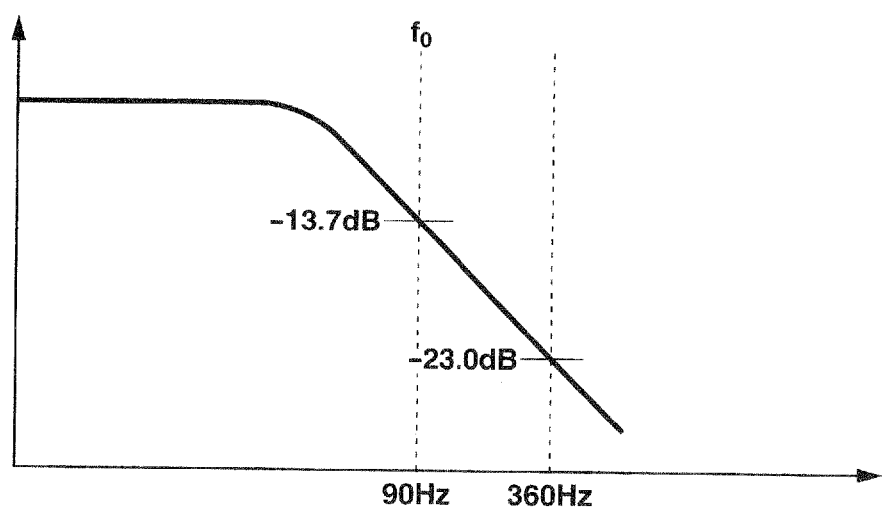
FIG. 7 is a view showing a filtering effect obtained when the synthesized signal appearing at a point "h" is used.

However, even if LPF has the filtering effect as shown in FIG. 7, it is considered that the integral effect can be poor. For example, as shown in U.S. Pat. No. 7,215,937 B2, a technique is proposed that an output signal of a detector circuit (frequency converter/detector circuit 100 in the present embodiment) is supplied to an automatic gain control circuit (AGC) (not shown) and AGC generates an AGC voltage for controlling a gain of an amplifier. The output signal of the detector circuit includes data. Therefore, to generate AGC voltage, LPF which has a time constant large enough to obtain flat data must be provided in AGC circuit, and the output signal is subjected to the filtering process of such LPF.

AGC voltage gives a time constant large enough to the output signal from the detector circuit to keep the gain of the amplifier steady. When AGC voltage is applied to the radio-controlled clock, a time constant in the order of several ten seconds is required because a signal of the clock is of one second period (1 bps). But as the larger time constant is used, AGC circuit becomes slower in its operation.

When data signal is faithfully reproduced to make AGC circuit operate quickly, the intermediate frequency component (for instance, 90 Hz) must adequately be removed from the synthesized signal. In this case, a waveform of the signal output from LPF of a simple configuration yields a serious problem. Further, if the intermediate frequency component (90 Hz) is not removed adequately, since the output signal of the detector circuit is used as AGC voltage, the data signal component cannot be separated sharply from the synthesized signal.

As described above, it is in effect equivalent to use the quadrupled intermediate frequency to detect I-signal, reversed I-signal, Q-signal and reversed Q-signal and add the detected signals together in the apparatus. However, it is sometimes difficult to remove the intermediate frequency adequately using LPF of a simple configuration in the apparatus.

Now, in the present embodiment of the invention, signals further shifted in phase are generated and are subjected to the detecting process, whereby a synthesized signal is generated. In the first embodiment, signals are generated, which are further shifted in phase by 45 degrees respectively from I-signal, the reversed I-signal, Q-signal, and the reversed Q-signal.

When the signals are obtained rotating the phase by using a filter, the signals can be delayed and distorted. In the present embodiment, a sin wave (sin ωt) and a cos wave (cos ωt) are added together to generate a signal which is shifted in phase by 45 degrees.

For instance, when it is assumed that a signal at the point "b" is expressed in b=sin ωt, and a signal at the point "c" is expressed in c=cos ωt, an added signal (b+c) of the signals at points "b" and "c" will be given as follows:

$$b+C=\sin \omega t+\cos \omega t=\sqrt{2} \sin (\omega t+\pi/4) \qquad (5)$$

The signal (b+C) is shifted in phase by 45 degrees form the original signal (sin ωt) at the point "b". By combining and adding together I-signal, the reversed I-signal, Q-signal, and the reversed Q-signal, signals can be obtained, which are shifted in phase by 45 degrees respectively from I-signal, the reversed I-signal, Q-signal, and the reversed Q-signal.

Output signals "d'", "e'", "f'" and "g'" of the fifth detector 153, sixth detector 154, seventh detector 155 and eighth detector 156 will be expressed as follows:

$$d'=\sin \omega t-\cos \omega t=\sqrt{2} \sin(\omega t-\pi/4)=\sqrt{2} \sin(\omega t+3\pi/4)$$

$$e'=\sin \omega t+\cos \omega t=\sqrt{2} \sin(\omega t+\pi/4)$$

$$f'=-\sin \omega t-\cos \omega t=-\sqrt{2} \sin(\omega t+\pi/4)=\sqrt{2} \sin(\omega t+5\pi/4)$$

$$g'=-\sin \omega t+\cos \omega t=-\sqrt{2} \sin(\omega t-\pi/4)=\sqrt{2} \sin(\omega t+7\pi/4)$$

The output signals "d", "e", "f" and "g" of the first detector 144, second detector 145, third detector 146 and forth detector 147 are expressed as follows:

$$d=\sin \omega t$$

$$e=-\sin \omega t=\sin(\omega t+\pi)$$

$$f=\cos \omega t=\sin(\omega t+\pi/2)$$

$$g=-\cos \omega t=\sin(\omega t+3\pi/2)$$

By multiplying the signals "d'", "e'", "f'" and "g'" by $1/\sqrt{2}$, new signals "d'", "e'", "f'" and "g'" are obtained. The signals "d", "e", "f" and "g" and signals "d'", "e'", "f'" and "g'" can be expressed by vectors as illustrated in FIG. 8.

Figure 9A:
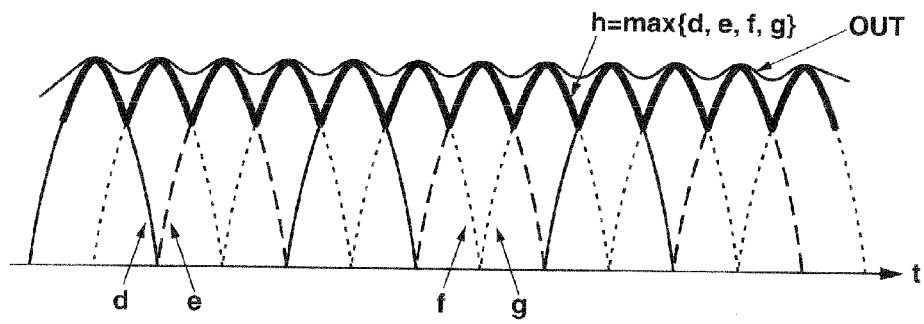
FIG. 9a is a view showing an example of a synthesized signal appearing at the point "h" in FIG. 5.
Figure 9B:
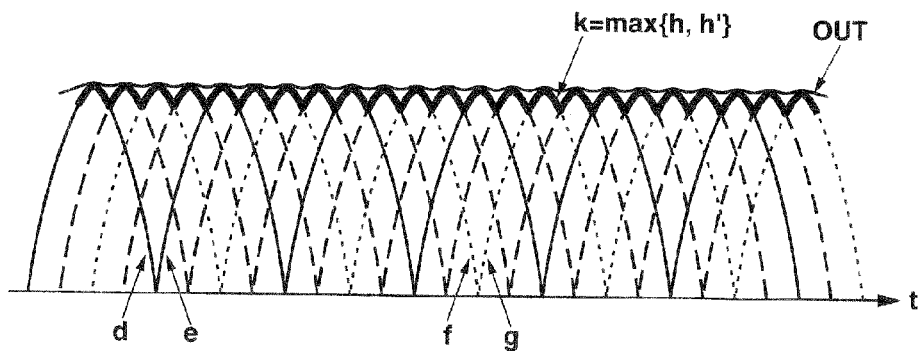
FIG. 9b is a view showing an example of a synthesized signal appearing at the point "k" in FIG. 5.

The signals "d", "e", "f", "g" and signals "d'", "e'", "f'", "g'" are added together to generate a synthesized signal "k'" (=Max {d, e, f, g, d', e', f', g'}). The synthesized signal "k'" is shown in FIG. 9b. The synthesized signal "h"(=Max {d, e, f, g}) is shown in FIG. 9a for a comparison purpose.

Figure 8:
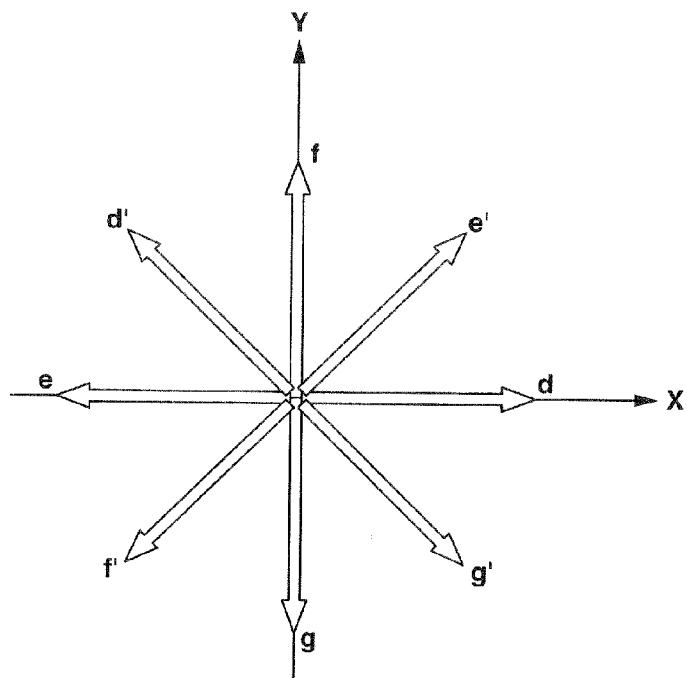
FIG. 8 is a view showing vectors representing output signals appearing at various points in FIG. 5.

As shown in FIG. 8, 8 signals "d", "e", "f", "g" "d'", "e'", "f'", and "g'" are disposed with the phase shifted by 45 degrees. A synthesized signal "h'"(=Max {d', e', f', g'}) of the signals "d'", "e'", "f'", and "g'" can be expressed as follows:

$$h'=\text{Max } \{\sqrt{(1-\cos 2(\omega t+\pi/4))}, \sqrt{(1+\cos 2(\omega t+\pi/4))}\}/\sqrt{2}$$

Then, an output signal of the adder 159 in FIG. 5, or, a synthesized signal "k'"(=Max {h, h'} will be expressed below.

$$k'=\text{Max } \{\sqrt{(1+\cos 2\omega t)}, \sqrt{(1+\cos 2(\omega t+\pi/4))}, \sqrt{(1-\cos 2\omega t)}, \sqrt{(1-\cos 2(\omega t+\pi/4))}\}/\sqrt{2}$$

Figure 10A:
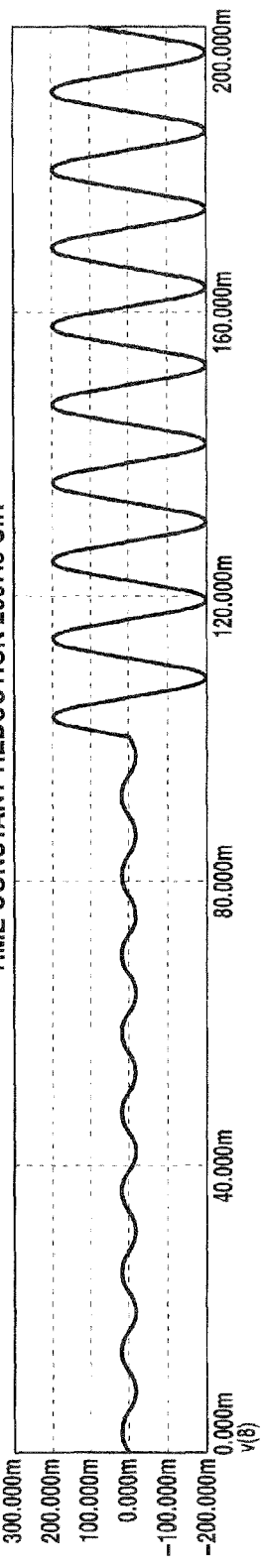
FIGS. 10a, 10b and 10c are views showing examples of signals appearing at various points in FIG. 5.
Figure 10B:
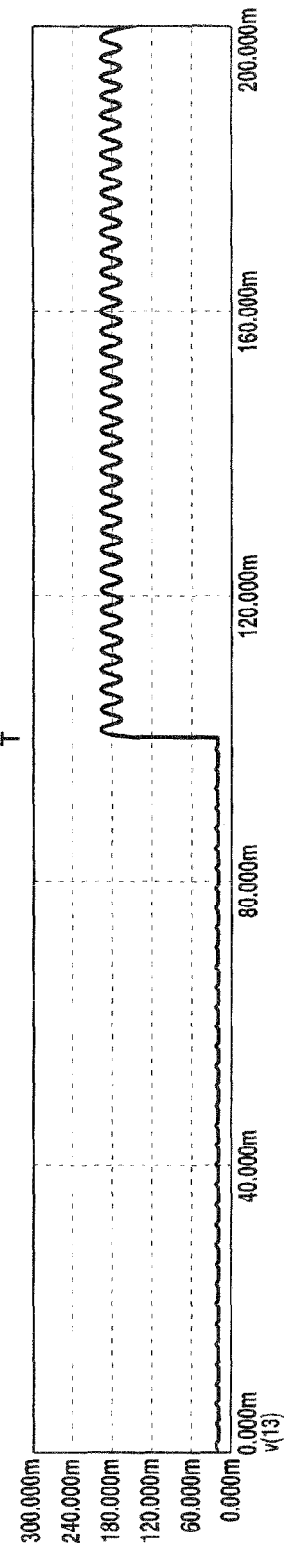
Figure 10C:
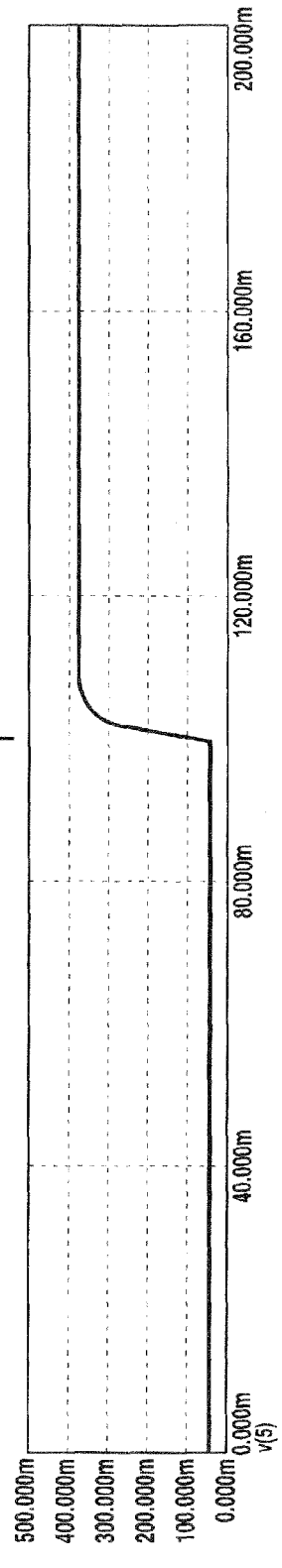

FIGS. 10a, 10b and 10c are views showing waveforms of the signals at the points "b", "h'" and "k" in the signal generating/synthesizing circuit 140 shown in FIG. 5.

Hereinafter, the level of the output signal "h'" of the multiplier 158 and the level of the synthesized signal "k" will be described.

As expressed by the expression (1), "d+e" will be expressed as follows:

$$d+e=|\sin \omega t|=\sqrt{(1-\cos 2\omega t)}/\sqrt{2}$$

With respect to $|\sin \omega t|=|\sqrt{(\sin^2 \omega t)}|$, $$\cos 2\omega t=\cos^2 \omega t - \sin^2 \omega t,$$

$$1=\sin^2 \omega t + \cos^2 \omega t,$$

Then, $\cos^2 \omega t=1/2(1+\cos 2\omega t)$ $$\sin^2 \omega t=1-1/2(1+\cos 2\omega t)=1/2(1-\cos 2\omega t)$$

Therefore, $$|\sin 2\omega t|=\sqrt{(1/2(1-\cos 2\omega t))}$$

$$|\cos 2\omega t|=\sqrt{(1/2(1+\cos 2\omega t))}$$

Therefore, the level of the output signal "h'" of the multiplier 158 and the level of the synthesized signal "k" will be given as follow:

$$h'=\text{Max }\{\sqrt{(1+\cos 2(\omega t+\pi/4))}, \sqrt{(1-\cos 2(\omega t+\pi/4))}\}/\sqrt{2}$$

$$k=\text{Max }\{\sqrt{(1+\cos 2\omega t)}, \sqrt{(1-\cos 2\omega t)}, \sqrt{(1+\cos 2(\omega t+\pi/4))}, \sqrt{(1-\cos 2(\omega t+\pi/4))}\}/\sqrt{2}$$

In the signal generating/synthesizing circuit 140 in the present embodiment, 8 signals with the phase shifted by 45 degrees from each other are detected, and the detected signals are added together, whereby the synthesized signal is produced. Therefore, the time constant of LPF will be small enough with respect to the synthesized signal. Further, even if LPF of a simple configuration is used, an adequate integral effect can be realized with respect to the synthesized signal, and signal distortion (modulated signal distortion) can be minimized.

Figure 11:
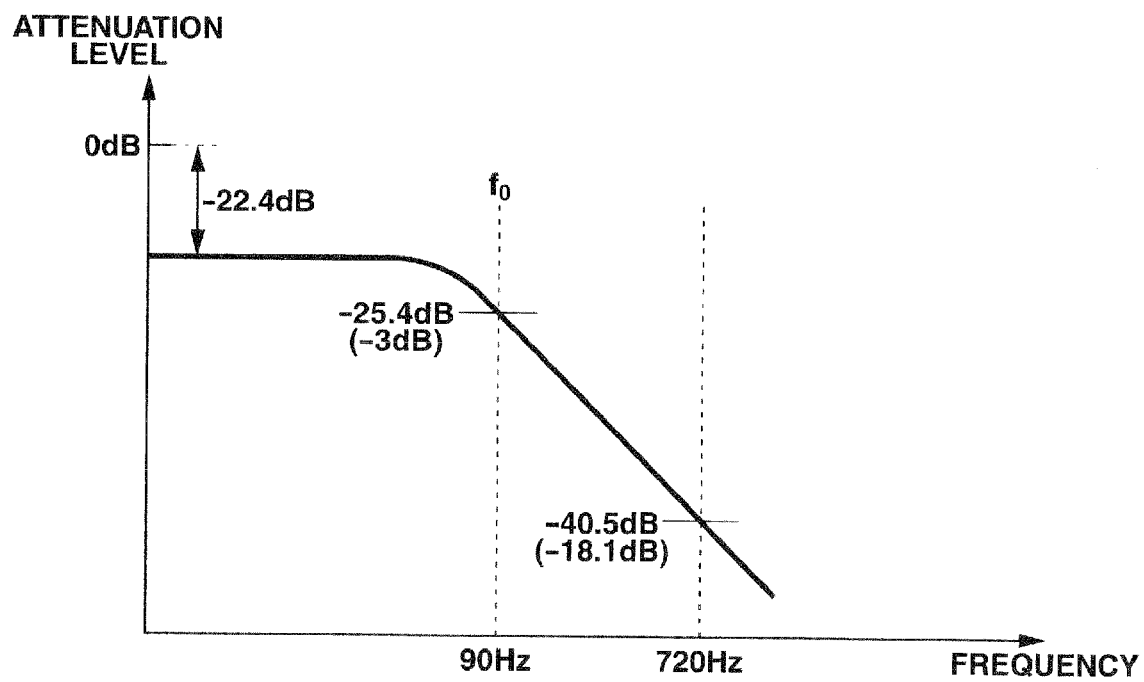
FIG. 11 is a view showing a filtering effect obtained in the first embodiment when the synthesized signal appearing at a point "k" is used.

FIG. 11 is a view showing the filtering effect in the present embodiment. In the filtering effect shown in FIG. 11, the intermediate frequency and cut off frequency f0 are set to 90 Hz. As shown in FIG. 11, attenuation of the ripple component of the synthesized signal is 22.4 dB, and it is deemed that a signal of a frequency which is 8 times higher than the intermediate frequency 90 Hz is generated as shown in FIG. 9b. The single stage RC filter having the cut off frequency f0 90 Hz attenuates the ripple component of 720 Hz by 18.1 dB. When passing through the RC filter, the ripple component of 720 Hz totally attenuates by 40.5 dB.

When passing through LPF, the ripple component of the synthesized signal produced by the signal generating/synthesizing circuit 140 in the present embodiment of the invention attenuates by up to 17.5 dB, compared with the synthesized signal produced by detecting and adding I-signal, the reversed I-signal, Q-signal and the reversed Q-signal and passing through the same LPF.

In the signal generating/synthesizing circuit 140 in the first embodiment of the invention, the reversed I-signal and reversed Q-signal are produced based on I-signal and Q-signal, respectively, and are detected, and further, the intermediate frequency signal having a phase corresponding to the phase difference between I-signal and Q-signal, the intermediate frequency signal having a phase corresponding to the phase difference between Q-signal and the reversed I-signal, the intermediate frequency signal having a phase corresponding to the phase difference between the reversed I-signal and reversed Q-signal, and the intermediate frequency signal having a phase corresponding to the phase difference between the reversed Q-signal and I-signal are produced and the produced intermediate frequency signals are detected and added together, whereby the synthesized signal having reduced ripple component is obtained.

Particularly, in the first embodiment of the invention, I-signal and Q-signal, I-signal and the reversed Q-signal, the reversed I-signal and Q-signal, and the reversed I-signal and reversed Q-signal are added together, whereby the signals shifted in phase by 45 degrees respectively from I-signal, Q-signal, reversed I-signal, and reversed Q-signal are generated. In the first embodiment of the invention, the generated signals are subjected to the detecting process and further to the adding process to produce the synthesized signal. The level of the synthesized signal is adjusted. Meanwhile, I-signal, Q-signal, and their reversed signals are subjected to the detecting process and further to the adding process to produce the synthesized signal. Then the former synthesized signal whose level is adjusted and the latter synthesized signal are added together, whereby the signal is produced, having a frequency substantially 8 times as high as the intermediate frequency.

In the first embodiment of the invention, the multiplier 158 adjusts the level of the synthesized signal output from the adder 157 to the level of the synthesized signal produced by detecting and adding I-signal, Q-signal, and their reversed signals, whereby both the synthesized signal to be supplied from multiplier 158 to the adder 158 and the synthesized signal to be supplied from the adder 148 to the adder 158 are adjusted in level. In this way, the synthesized signals having substantially the same level are supplied to the adder 159.

Other Example of Signal Generating/Synthesizing Circuit

Now, the second embodiment of the invention will be described. In the first embodiment of the invention, based on I-signal, the reversed I-signal, Q-signal and the reversed Q-signal, the signals are produced, which are different in phase by 45 degrees respectively from I-signal, the reversed I-signal, Q-signal and the reversed Q-signal. The produced signals are added into the synthesized signal. In the second embodiment of the invention, signals are produced, which are shifted in phase by an arbitrary degrees θ from the original signals.

Figure 12:
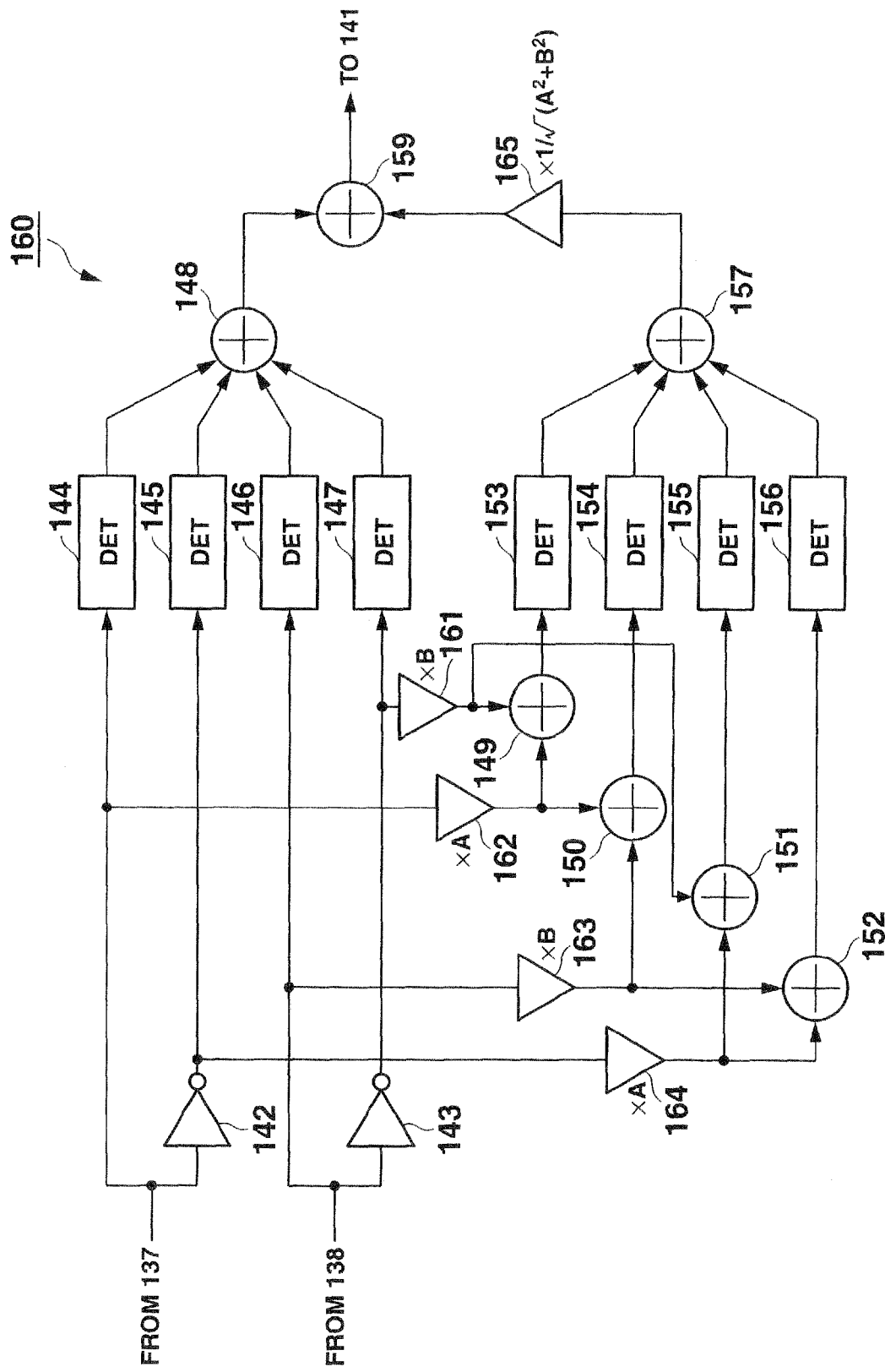
FIG. 12 is a view showing a signal generating/synthetsizing circuit in the second embodiment of the invention.

FIG. 12 is a block diagram of a signal generating/synthesizing circuit 160 in the second embodiment of the invention. In the block diagram of FIG. 12, like reference numerals represent like elements of the signal generating/synthesizing circuit 140 shown in FIG. 5.

As shown in FIG. 12, the signal generating/synthesizing circuit 160 in the second embodiment of the invention comprises multipliers 161, 162, 163 and 164. The multiplier 162 amplifies I-signal with a gain "A", the multiplier 164 amplifies the reversed I-signal with a gain "A", the multiplier 163 amplifies Q-signal with a gain "B", and the multiplier 161 amplifies the reversed Q-signal with a gain "B". An output signal of the multiplier 161 is supplied to adders 149, 151, an output signal of the multiplier 162 is supplied to adders 149, 150, an output signal of the multiplier 163 is supplied to adders 150, 152, and an output signal of the multiplier 164 is supplied to adders 151, 152.

In the second embodiment of the invention, the multiplier 165 multiplies the output signal of the adder 157 by $1/\sqrt{(A^2+B^2)}$.

In the second embodiment of the invention, output signals d'', e'', f'' and g'' of the fifth detector 153, sixth detector 154, seventh detector 155 and eighth detector 156 are given as follows:

$$d''=A\sin\omega t - B\cos\omega t = \sqrt{(A2+B2)}\sin(\omega t-\theta)$$

$$e''=A\sin\omega t + B\cos\omega t = \sqrt{(A2+B2)}\sin(\omega t+\theta)$$

$$f''=-A\sin\omega t - B\cos\omega t = \sqrt{(A2+B2)}\sin(\omega t+\pi+\theta)$$

$$g''=-A\sin\omega t + B\cos\omega t = \sqrt{(A2+B2)}\sin(\omega t-\theta) = \sqrt{(A2+B2)}\sin(\omega t+\pi-\theta)$$

where $\cos\theta = A/\sqrt{(A2+B2)}$ and $\sin\theta = B/\sqrt{(A2+B2)}$

Figure 13:
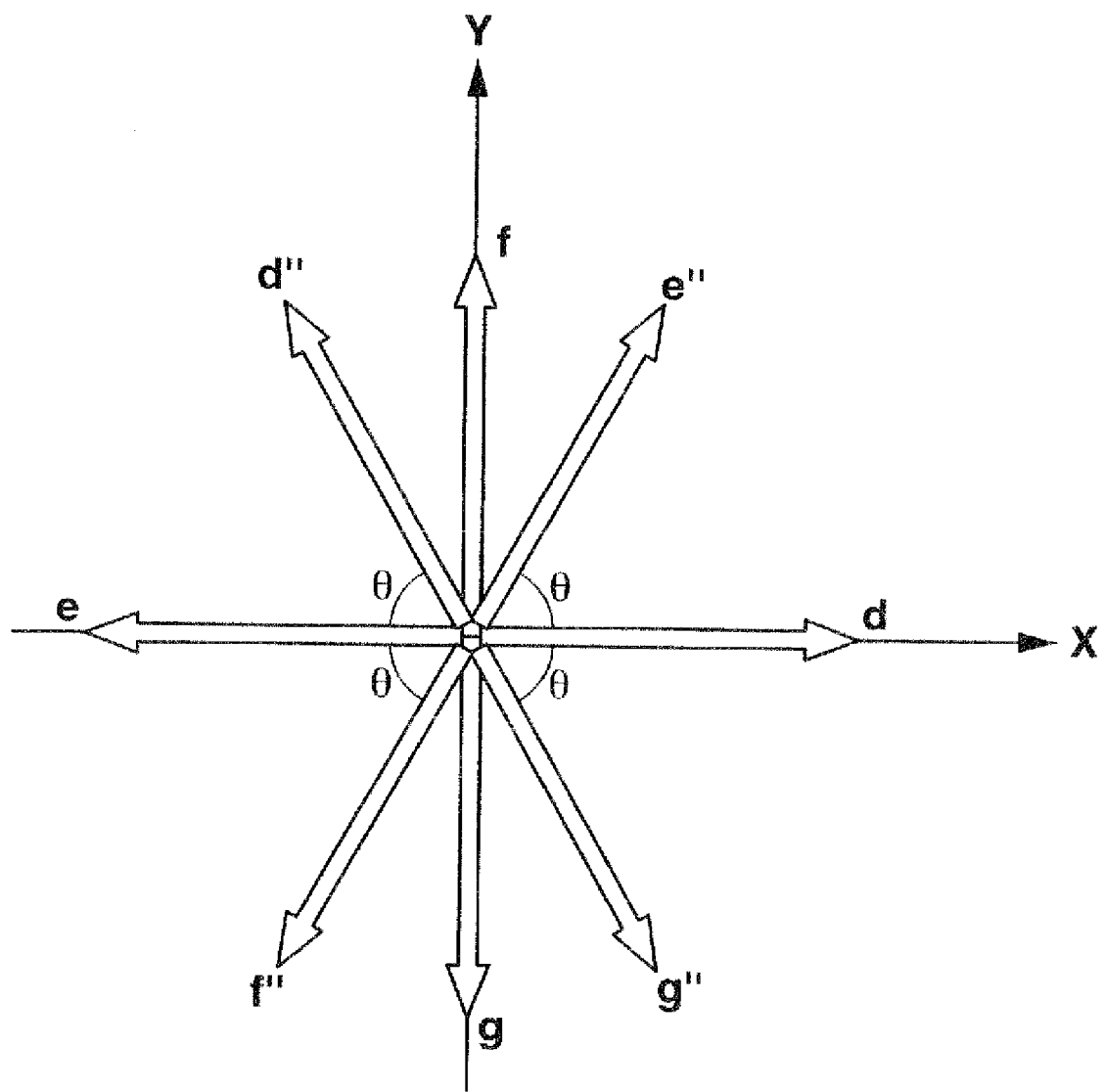
FIG. 13 is a view showing vectors representing output signals appearing at various points in FIG. 12.

Multiplying the output signals d'', e'', f'' and g'' by $1/\sqrt{(A2+B2)}$, we obtain new signals d''', e''', f''' and g''', which are represented by vectors shown in FIG. 13.

It is preferable that the gain "A" of the multipliers 162, 164 and the gain "B" of the multipliers 161, 163 can be adjusted by CPU 50. CPU 50 calculates the gains "A", "B" based on the phase θ and sets the calculated gains "A", "B" to the multipliers 162, 164, 161, 163. Using these multipliers 162, 164, 161, 163, signals with predetermined phase shifted by θ are produced and the produced signals are subjected to the detecting process.

As described above, in the second embodiment of the invention, I-signal and the reversed I-signal are amplified with the gain "A", and Q-signal and the reversed Q-signal are amplified with the gain "B". Then, the amplified I-signal and Q-signal, I-signal and reversed Q-signal, reversed I-signal and Q-signal, and reversed I-signal and reversed Q-signal are added together and are subjected to the detecting process, whereby signals having phases ωt+θ, ωt−θ, ωt+π+θ, and ωt+π−θ respectively are produced.

In particular, since CPU 50 calculates the gains "A", "B" of the multipliers, the signals having the predetermined phases can be produced.

Still Other Example of Signal Generating/Synthesizing Circuit

Now, the third embodiment of the invention will be described. In the second embodiment of the invention, I-signal and the reversed I-signal are multiplied by "A", and Q-signal and the reversed Q-signal are multiplied by "B", whereby signals having phases ωt+θ, ωt−θ, ωt+π+θ, and θt+π−θ respectively are produced. In the third embodiment, coefficients A1, B1 in an expression A1 sin ωt+B1 cos ωt can be adjusted for each adder.

Figure 14:
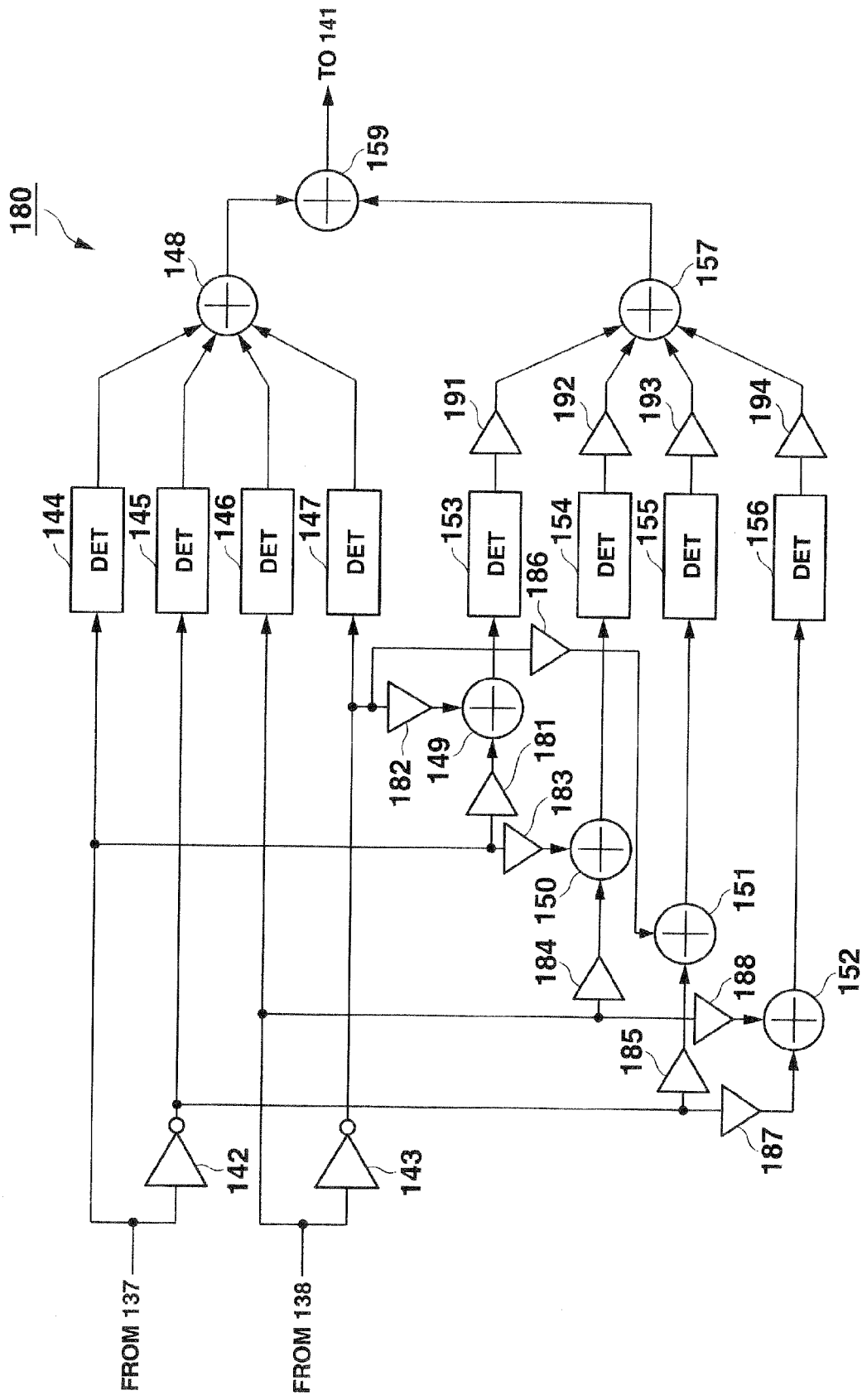
FIG. 14 is a view showing a signal generating/synthetsizing circuit in the third embodiment of the invention.
Figure 15:
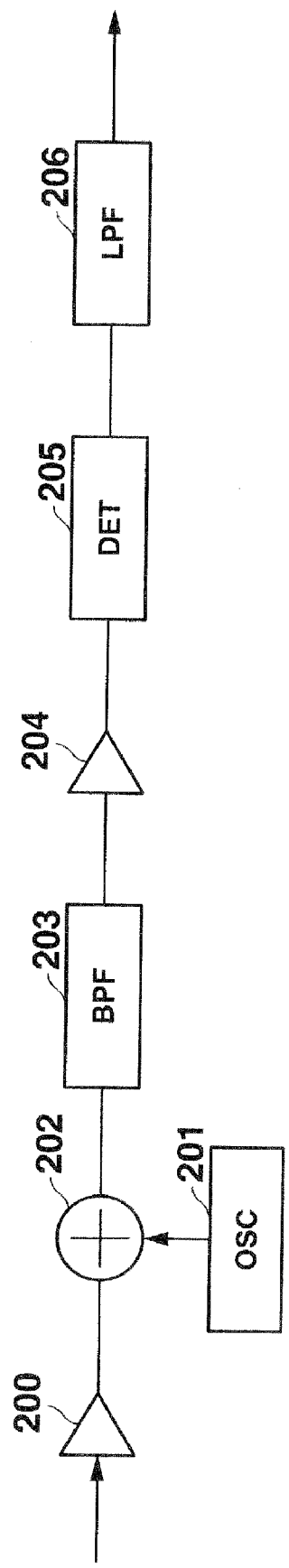
FIG. 15 is a view showing a conventional frequency converter circuit and detecting circuit.

FIG. 14 is a block diagram of a signal generating/synthesizing circuit 180 in the third embodiment of the invention. In the block diagram of FIG. 14, like reference numerals represent like elements of the signal generating/synthesizing circuit 160 shown in FIG. 12.

As shown in FIG. 14, in the third embodiment the adders 149, 150, 151 and 152 are provided with multipliers for amplifying signals to be input thereto, respectively. As shown in FIG. 14, the adder 149 is provided with multipliers 181, 182 at its input side.

The adder 149 is provided with multipliers 181, 182 at its input side, wherein the multiplier 181 amplifies I-signal with the gain A1, and the multipliers 182 amplifies the reversed Q-signal with the gain B1.

The adder 150 is provided with multipliers 183, 184 at its input side, wherein the multiplier 183 amplifies I-signal with the gain A2, and the multipliers 184 amplifies Q-signal with the gain B2.

The adder 151 is provided with multipliers 185, 186 at its input side, wherein the multiplier 185 amplifies the reversed I-signal with the gain A3, and the multipliers 186 amplifies the reversed Q-signal with the gain B3.

The adder 152 is provided with multipliers 187, 188 at its input side, wherein the multiplier 187 amplifies the reversed I-signal with the gain A4, and the multipliers 188 amplifies Q-signal with the gain B4.

The outputs of the detectors 153, 154, 155 and 156 are connected with amplifiers 191, 192, 193 and 194, respectively, wherein these amplifiers amplify the output signals of the detectors with gain $1/\sqrt{(Ai2+Bi2)}$. The gains of the amplifiers 191, 192, 193 and 194 are set to $1/\sqrt{(A12+B12)}$, $1/\sqrt{(A22+B22)}$, $1/\sqrt{(A32+B32)}$ and $1/\sqrt{(A42+B42)}$, respectively.

Depending on the gains set to the multipliers 181, 182, 183, 184 and 185, and the gains set to the multipliers 191, 192, 193 and 194, signals having a phase sin(ωt+θi) are output from the multipliers 191, 192, 193 and 194, respectively, where tan θi=B/A. The output signals are added together by the adder 157. The output signal of the adder 157 and the output signal of the adder 148 are added together by the adder 159. The output signal of the adder 159 is supplied to LPF 141.

It is preferable that the gains of the multipliers 181, 182, 183, 184, 185, 186 and 187 and the gains of the multipliers 191, 192, 193 and 194 can be adjusted by CPU 50, whereby adjusting the gains A1 and B1, signals having a desired phase (ωt+θi) are produced. The produced signals are subjected to the detecting process and further to the adding process.

According to the embodiments of the invention, a receiving circuit can be provided, which comprises a signal generating/synthesizing circuit having a simple circuit configuration, and receives a modulated signal with high accuracy. And further, timepieces having the receiving circuit are provided.

The present invention is by no means restricted to the embodiments described above, and alterations and modifications can be made to the embodiments within the scope of claims attached hereto. The alterations and modifications to the embodiment fall within the scope of the invention.

What is claimed is:

1. A receiving circuit comprising:
   an antenna circuit for receiving an electromagnetic wave to obtain an electric signal;
   an amplifying unit for amplifying the electric signal obtained by the antenna circuit;
   a frequency converter/detector unit for converting a frequency of the electric signal amplified by the amplifying unit to obtain an intermediate frequency signal, and for detecting the intermediate frequency signal, thereby outputting a demodulated signal; and
   a filtering unit for removing an intermediate frequency component from the demodulated signal output from the frequency converter/detector unit,
   wherein the frequency converter/detector unit comprises:
      a local oscillator for generating an oscillation signal;
      plural mixers for mixing the signal amplified by the amplifying unit with the oscillation signal from the local oscillator to generate a first intermediate frequency signal and a second intermediate frequency signal, wherein the first intermediate frequency signal and second intermediate frequency signal are shifted in phase from each other by 90 degrees; and
      a signal generating synthesizing unit for generating other intermediate frequency signals based on the first intermediate frequency signal and the second intermediate frequency signal, wherein said other intermediate frequency signals are shifted in phase from the first intermediate frequency signal and the second intermediate frequency signal, and for detecting the first intermediate frequency signal, the second intermediate frequency signal and said other intermediate frequency signals and adding the detected signals together, thereby generating a synthesized signal, wherein the signal generating/synthesizing unit reverses the first intermediate frequency signal and second intermediate frequency signal output from the mixers and outputs the reversed first intermediate frequency signal and the reversed second intermediate frequency signal as first other intermediate frequency signals, and generates signals and outputs the generated signals as second other intermediate frequency signals, and wherein said second other intermediate frequency signals have a phase equivalent to a phase difference between the first intermediate frequency signal and the second intermediate frequency signal, a phase equivalent to a phase difference between the second intermediate frequency signal and the reversed first intermediate frequency signal, a phase equivalent to a phase difference between the reversed first intermediate frequency signal and the reversed second intermediate frequency signal, and a phase equivalent to a phase difference between the reversed second intermediate frequency signal and the first intermediate frequency signal, respectively.

2. The receiving circuit according to claim 1, wherein the signal generating/synthesizing unit comprises:
a first adder for adding together the first intermediate frequency signal and the second intermediate frequency signal to generate an added signal;
a second adder for adding together the first intermediate frequency signal and the reversed second intermediate frequency signal to generate an added signal;
a third adder for adding together the reversed first intermediate frequency signal and the second intermediate frequency signal to generate an added signal; and
a fourth adder for adding together the reversed first intermediate frequency signal and the reversed second intermediate frequency signal to generate an added signal,
wherein the signal generating/ synthesizing unit generates the second other intermediate frequency signals based on the added signals generated by the first adder, second adder, third adder, and fourth adder.

3. The receiving circuit according to claim 2, wherein the signal generating/ synthesizing unit further comprises:
a fifth adder for adding together the detected second other intermediate frequency signals to generate an added signal; and
a multiplier for multiplying the added signal generated by the fifth adder by a predetermined gain.

4. The receiving circuit according to claim 3, wherein the signal generating/ synthesizing unit further comprises:
a first multiplier for amplifying the first intermediate frequency signal;
a second multiplier for amplifying the reversed first intermediate frequency signal;
a third multiplier for amplifying the second intermediate frequency signal; and
a fourth multiplier for amplifying the reversed second intermediate frequency signal, wherein the first multiplier and second multiplier are set to a same gain, and the third multiplier and fourth multiplier are set to a same gain.

5. The receiving circuit according to claim 2, wherein the signal generating/ synthesizing unit further comprises:
a multiplier for multiplying the first intermediate frequency signal to be supplied to the first adder;
a multiplier for multiplying the second intermediate frequency signal to be supplied to the first adder;
a multiplier for multiplying the first intermediate frequency signal to be supplied to the second adder;
a multiplier for multiplying the reversed second intermediate frequency signal to be supplied to the second adder;
a multiplier for multiplying the reversed first intermediate frequency signal to be supplied to the third adder;
a multiplier for multiplying the second intermediate frequency signal to be supplied to the third adder;
a multiplier for multiplying the reversed first intermediate frequency signal to be supplied to the fourth adder; and
a multiplier for multiplying the reversed second intermediate frequency signal to be supplied to the fourth adder.

6. The receiving circuit according to claim 3, further comprising a control unit for adjusting a gain of the multiplier.

7. A timepiece comprising:
the receiving circuit of claim 1, wherein the electromagnetic wave received by the antenna circuit carries time information;
an extracting unit for extracting the time information from a signal output from the filtering unit of the receiving circuit;
a time counting unit for counting time;
a display unit for displaying the time counted by the time counting unit; and
a time correcting unit for correcting the time counted by the time counting unit based on the time information extracted by the extracting unit.

* * * * *